(12) United States Patent
O'Toole

(10) Patent No.: US 9,780,758 B2
(45) Date of Patent: Oct. 3, 2017

(54) ENHANCED COUPLER PERFORMANCE WINDING APPROACH

(71) Applicant: MACOM Technology Solutions Holdings, Inc., Lowell, MA (US)

(72) Inventor: Thomas O'Toole, Ennis (IE)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 14/815,364

(22) Filed: Jul. 31, 2015

(65) Prior Publication Data

US 2017/0033762 A1  Feb. 2, 2017

(51) Int. Cl.

| | |
|---|---|
| *H01F 27/28* | (2006.01) |
| *H01F 7/06* | (2006.01) |
| *H04B 1/52* | (2015.01) |
| *H03H 7/48* | (2006.01) |
| *H01F 27/24* | (2006.01) |
| *H03H 3/013* | (2006.01) |
| *H01F 17/06* | (2006.01) |
| *H01F 19/06* | (2006.01) |
| *H01F 27/06* | (2006.01) |

(52) U.S. Cl.
CPC .............. *H03H 7/482* (2013.01); *H01F 17/06* (2013.01); *H01F 19/06* (2013.01); *H01F 27/06* (2013.01); *H01F 27/24* (2013.01); *H01F 27/28* (2013.01); *H03H 3/013* (2013.01); *H01F 2017/067* (2013.01); *H01F 2027/065* (2013.01)

(58) Field of Classification Search
CPC .......... H03H 7/48; H03H 3/013; H03H 7/482; H01F 27/28; H01F 27/24; H01F 2017/067; H01F 17/08; H01F 19/02; H01F 19/04; H01F 19/06; H01F 27/06; H01F 17/06; H01F 2027/065
USPC ....... 336/170, 221, 222, 225; 29/600, 602.1, 29/605, 606; 333/118, 119
See application file for complete search history.

(56) References Cited

U.S. PATENT DOCUMENTS

| | | | | |
|---|---|---|---|---|
| 3,349,345 | A * | 10/1967 | Winegard | .............. H03H 7/482 333/131 |
| 4,631,504 | A | 12/1986 | Matsuda et al. | ................. 333/25 |
| 4,789,845 | A * | 12/1988 | Reddy | ....................... H03H 7/48 333/100 |

(Continued)

FOREIGN PATENT DOCUMENTS

| | | | | |
|---|---|---|---|---|
| JP | 56036111 A | 9/1981 | ............. | H01F 19/04 |
| JP | 200271161 A | 9/2002 | ............... | H03H 7/48 |

OTHER PUBLICATIONS

"RF and Microwave Transformer Fundamentals", Mini-Circuits, http://www.mpdigest.com/issue/Articles/2009/oct/Mini/, Oct. 2009, pp. 1-11.

*Primary Examiner* — Mangtin Lian
(74) *Attorney, Agent, or Firm* — Christopher P. Maiorana, PC

(57) ABSTRACT

An apparatus includes a carrier substrate, a ferrite core, a first set of wire windings, a second set of wire windings, a third set of wire windings, and a fourth set of wire windings. The ferrite core is attached to the carrier substrate. The first set of wire windings, the second set of wire windings, the third set of wire windings, and the fourth set of wire windings pass through the ferrite core and between the ferrite core and the carrier substrate to which the ferrite core is attached.

20 Claims, 8 Drawing Sheets

(56) References Cited

U.S. PATENT DOCUMENTS

| | | | | |
|---|---|---|---|---|
| 6,114,924 A | * | 9/2000 | Cain | H03H 7/482 |
| | | | | 333/112 |
| 6,784,521 B2 | * | 8/2004 | Setty | H03H 7/48 |
| | | | | 257/662 |
| 7,705,703 B2 | * | 4/2010 | Tsao | H01F 17/062 |
| | | | | 336/131 |
| 8,634,784 B2 | * | 1/2014 | Bertram | H01P 5/184 |
| | | | | 333/109 |
| 2003/0222748 A1 | * | 12/2003 | Cern | H01F 19/08 |
| | | | | 336/178 |
| 2006/0006963 A1 | | 1/2006 | Ji | 333/181 |
| 2010/0045420 A1 | | 2/2010 | Buckmeier et al. | 336/221 |
| 2012/0176756 A1 | | 7/2012 | Gailus et al. | 361/752 |

* cited by examiner

ENHANCED COUPLER PERFORMANCE WINDING APPROACH

FIELD OF THE INVENTION

The present invention relates to passive radio frequency (RF) couplers generally and, more particularly, to a method and/or apparatus for implementing an enhanced coupler performance winding approach.

BACKGROUND OF THE INVENTION

Conventional approaches for manufacturing a radio frequency (RF) ferrite core coupler involve pre-epoxying a ferrite core to a carrier PCB (printed circuit board) substrate, then adding wire windings to each side of the ferrite core. Epoxy bulging out from under the sides of the ferrite core can have varying heights. The varying heights lead to differing performance as the wire windings of the coupler settle in different positions.

It would be desirable to implement an enhanced coupler performance winding approach.

SUMMARY OF THE INVENTION

The present invention concerns an apparatus including a carrier substrate, a ferrite core, a first set of wire windings, a second set of wire windings, a third set of wire windings, and a fourth set of wire windings. The ferrite core is attached to the carrier substrate. The first set of wire windings, the second set of wire windings, the third set of wire windings, and the fourth set of wire windings pass through the ferrite core and between the ferrite core and the carrier substrate to which the ferrite core is attached.

The objects, features and advantages of the present invention include providing an enhanced coupler performance winding approach that may (i) allow product performance to extend beyond 1225 GHz, (ii) allow adjustment of wire winding position for improved product performance, (iii) secure wire windings in tuned position along with a core in a single process step, (iv) reduce design time, (v) facilitate selection of optimum core through a thermal sweeping approach, (vi) eliminate or reduce tuning time, (vii) implement a wire diameter approach to allow easy design of tilt, flatness, and coupling return loss, (viii) provide robust coupler tuning, and/or (ix) be implemented in a surface mount package.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
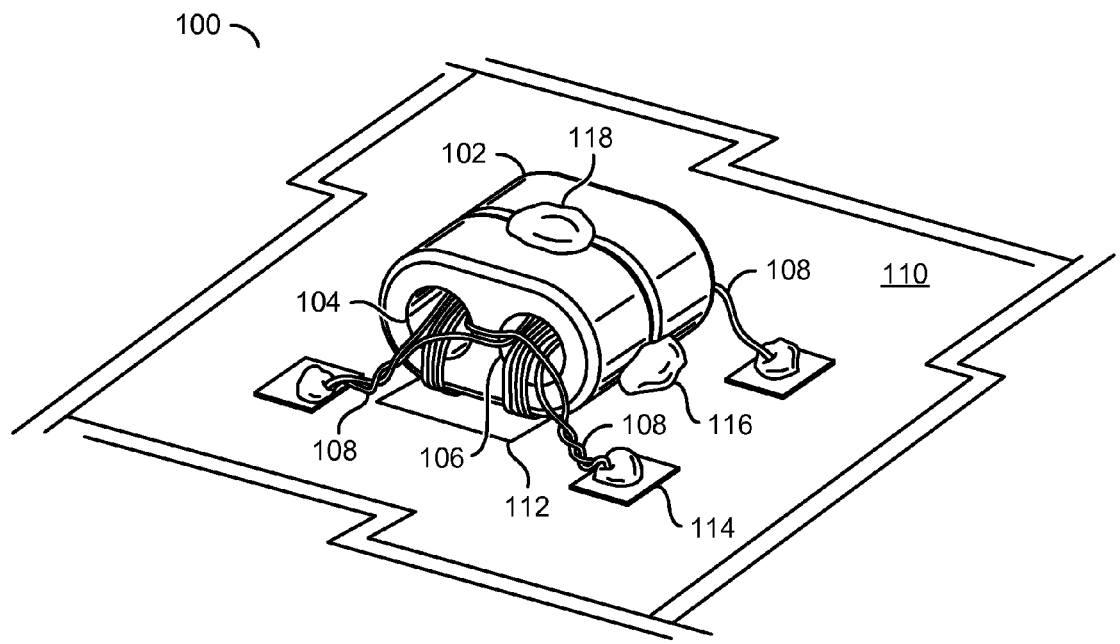
FIG. 1 is a diagram illustrating a perspective view of an RF coupler in accordance with an embodiment of the invention.

Referring to FIG. 1, a diagram is shown illustrating a perspective view of a radio frequency (RF) coupler 100 in accordance with an embodiment of the invention. The RF coupler 100 generally includes a core 102 having a first hole 104 and a second hole 106. The holes 104 and 106 are shown passing through the core 102 from a first (e.g., front) end to a second (e.g., back) end. The core 102 may be implemented, in one example, as a ferrite core. In various embodiments, the material used to form the core 102 may include, but is not limited to, Manganese-Zinc Ferrite, Nickel-Zinc Ferrite, Carbonyl, Phenolic, and/or Polyamide. The core 102 may be referred to as a dual hole core or a "binocular" core, because of the shape of the core. Each of a number of wire windings 108 enters a particular one of the holes 104 and 106 from one end of the core 102 and exits the particular hole 104 or 106 from the opposite end of the core 102. The wire windings 108 return to the respective hole on the first end of the core 102 by passing beneath the core 102 to begin another turn through the hole. The wire windings 108 pass through the holes 104 and 106 and then return to the same hole by looping around the bottom of the core 102 in a space between the core 102 and a carrier substrate 110. The wire windings 108 are generally applied to the core 102 prior to attaching the core 102 to the carrier substrate 110. When the core 102 is attached (mounted) to the carrier substrate 110, the holes 104 and 106 generally run parallel to a top surface of the carrier substrate 110.

The carrier substrate 110 is generally implemented as a printed circuit board (PCB). In various embodiments, a ground plane 112 is disposed on the top surface of the carrier substrate 110 and passes under the core 102. In some embodiments, the carrier substrate 110 may include the ground plane 112 sandwiched between layers of dielectric material. A number of metal pads 114 may also be disposed on the top surface of the carrier substrate 110. The wire windings 108 may be soldered or welded to the pads 114. The pads 114 may connect the RF coupler 100 to components (e.g., resistors, capacitors, etc.) mounted on the surface of the carrier substrate 110. The pads 114 may be connected (e.g., by vias) to connections (or pins) on an underside (bottom surface) of the carrier substrate 110.

The core (or cores) 102 and wire windings 108 may be attached to the carrier substrate 110 by an adhesive material (e.g., epoxy, etc.) 116 carefully applied along each side of the core 102 such that the adhesive material does not encroach on the space in which the wire windings 108 are located between the core 102 and the carrier substrate 110. Positioning the epoxy along the sides of the core 102 adds strength and tune position security not available with conventional coupler designs. In various embodiments, the core 102 is not dependent on a paralene coating bond to secure the core 102 to the carrier substrate 110. In some embodiments, the core 102 may be made up of a number of sections, and the sections may be bonded together by an adhesive material (e.g., epoxy, etc.) 118.

Figure 2:
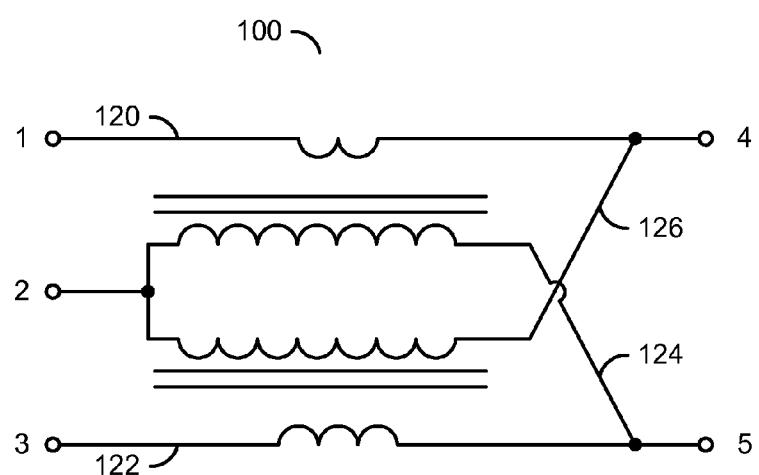
FIG. 2 is a schematic diagram illustrating the radio frequency (RF) coupler of FIG. 1.

Referring to FIG. 2, a schematic diagram of the RF coupler 100 in accordance with an example embodiment of the invention is shown. In various embodiments, the RF coupler 100 has three connections (or ports) on one end (e.g., marked 1, 2, and 3) and two connections (or ports) on the other end (e.g., marked 4 and 5). Port 1 may implement an input port. Port 2 may implement a ground port. Port 3 may implement a coupled port. Port 4 may implement an output port. Port 5 may be connected to an external impedance.

A first wire winding 120 enters the RF coupler 100 from input port 1 on the carrier substrate 110. In one example, wire winding 120 makes one or more full turns through the hole 104 and is connected to the output port 4 on the carrier substrate 110. A "full turn" is defined herein as a winding that passes through the length of a hole in the core 102, passes underneath the length of the core 102 between the core 102 and the carrier substrate 110, and then passes through the length of the hole again.

A second wire winding 122 enters the RF coupler 100 from the coupled port 3 on the carrier substrate 110. The wire winding 122 makes one or more full turns though the hole 106 and is then connected to the carrier substrate 110 at the port 5, where the wire winding 122 is connected to an external impedance (e.g., a 75 ohm resistor, etc.) and grounded. A third wire winding 124 is connected to an end of the wire winding 122 connected to the port 5 before the wire winding 122 enters the core 102. The wire winding 124 makes a number of full turns through the hole 104 and then exits the core 102. A fourth wire winding 126 is connected to an end of the wire winding 120 connected to port 4 before the wire winding 120 enters the core 102. The wire winding 126 makes a number of full turns through the hole 106 and then exits the core 102, where the wire winding 126 is connected to the wire winding 124, and the two wire windings 124 and 126 are connected to the carrier substrate 110 at the port 2 to be grounded.

In one example, the RF coupler 100 in accordance with the present invention may be used in an amplifier in a communications system such that the input signal is a broadband signal carrying programming information and other information to and from subscribers. In various embodiments, the RF coupler 100 may extract a portion of the signal provided to the input port 1. The extracted portion of the signal may be provided to the coupled port 3, and the remainder of the signal may be provided to the output port 4. In one example, the extracted portion of the input signal may be provided to a test point to allow service personnel to test the input signal without interrupting the transmission of the remainder of the input signal to downstream subscribers. The tightly wound wire windings passing between the core 102 and the carrier substrate 110 generally extend the high frequency performance (e.g., insertion loss and return loss) beyond the level of performance provided by conventional winding techniques.

In general, many different turn ratios may be used to achieve any desired extracted signal level. For example, a turn ratio may be used that would yield an extracted portion of the signal that is approximately −8 dB, −12 dB, etc. from the level of the input signal.

Figure 3:
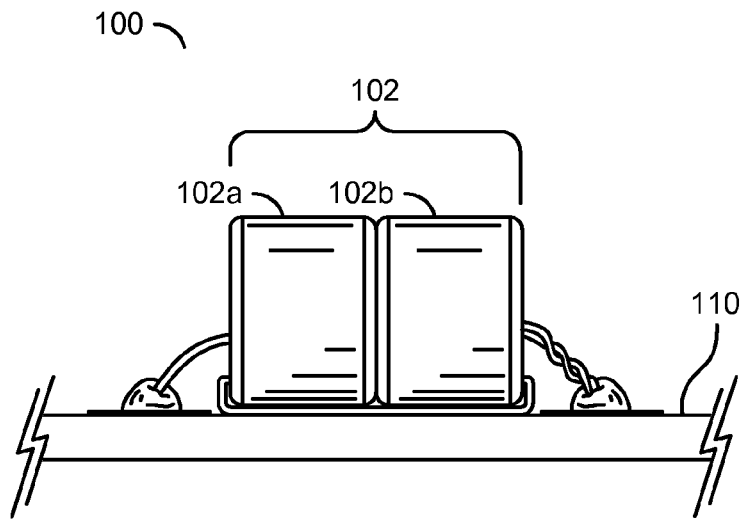
FIG. 3 is a diagram illustrating a side view of the RF coupler of FIG. 1.

Referring to FIG. 3, a diagram of a side view of the RF coupler 100 of FIG. 1 is shown illustrating the tightly wound wire windings 108 passing between the core 102 and the carrier substrate 110. Epoxy used to mount the core 102 to the carrier substrate 110 and bond multiple core sections (e.g., 102a, 102b, etc.) together is omitted for clarity. Sandwiching the wire windings between the core 102 and the carrier substrate 110 prevents potential detuning of the RF coupler 100 once the wire windings are in a tuned position.

Figure 4:
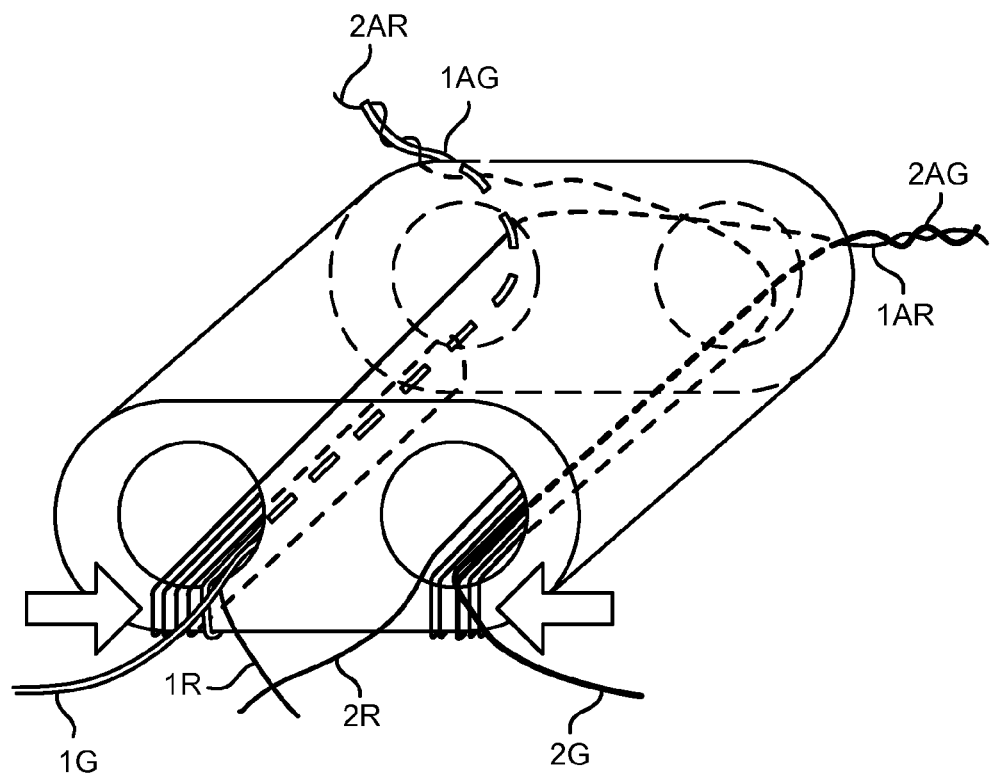
FIG. 4 is a diagram illustrating a winding approach in accordance with an embodiment of the invention.

Referring to FIG. 4, a diagram is shown illustrating a wiring approach in accordance with an example embodiment of the invention. In various embodiments, a thicker (e.g., larger gauge) winding wire may be used on the coupling port (1G) to offset over coupling at higher frequencies, thus providing a flat coupling with improved return losses. In various embodiments, winding wire ranging from about 34 to about 38 gauge may be used. However, other gauge wire windings may be implemented to meet design criteria of a particular application. Varying the winding wire thickness ratios allows good control of important parameters, such as coupler flatness and tilt.

Figure 5:
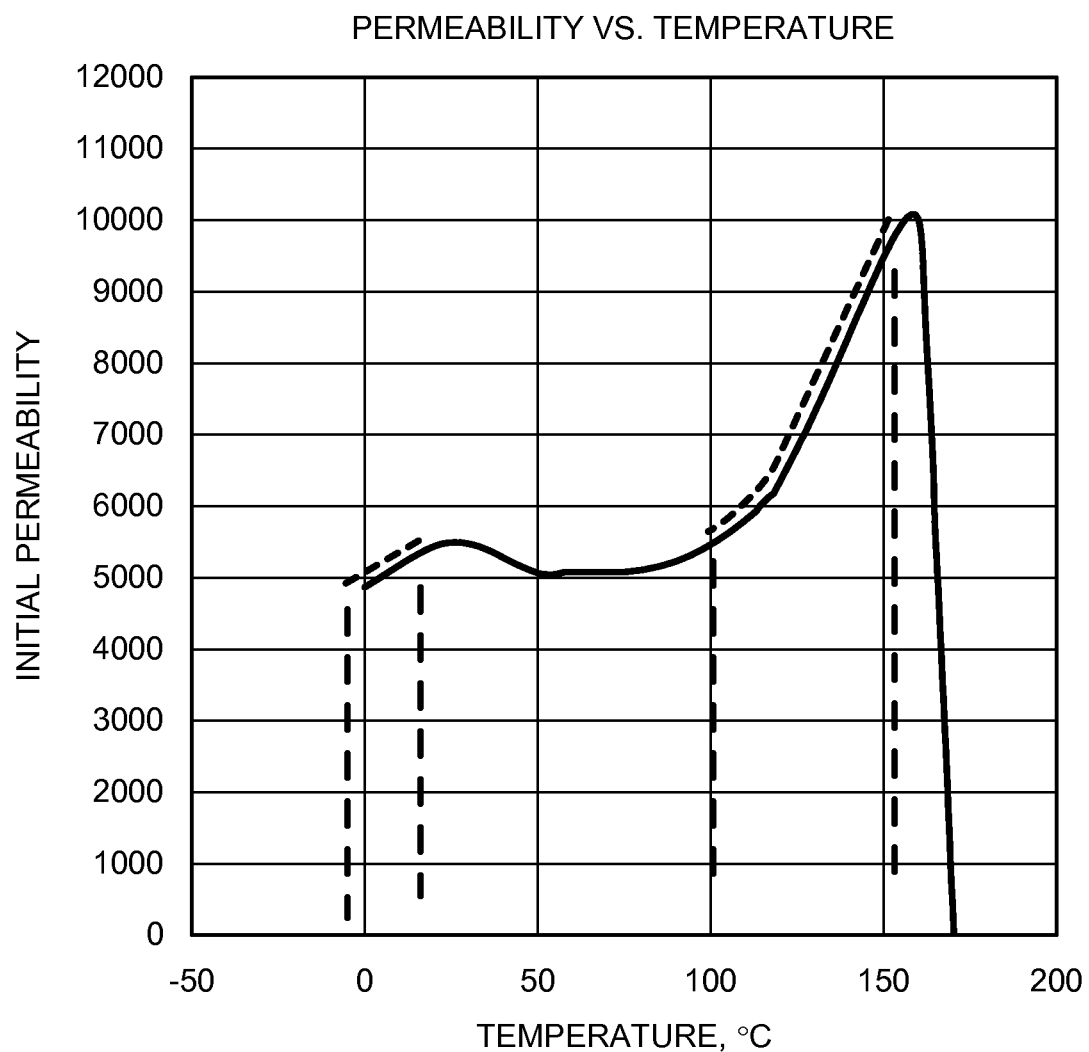
FIG. 5 is a diagram illustrating a thermal sweep technique in accordance with an embodiment of the invention.

Referring to FIG. 5, a diagram is shown illustrating core permeability variation with temperature variation. In addition to varying winding wire thickness, a thermal sweep technique may be used to quickly identify an ideal permeability for the core 102. For example, a low cost, highly temperature sensitive core may be used during design of the RF coupler 100. A generic design with a medium permeability (e.g., ~5000µ) core tested over high and low temperature ranges (e.g., indicated by dashed lines in FIG. 5) generally allows tracking of permeability performance variation with temperature, enabling a designer to quickly and easily select an optimal core permeability for a particular application.

Figure 6:
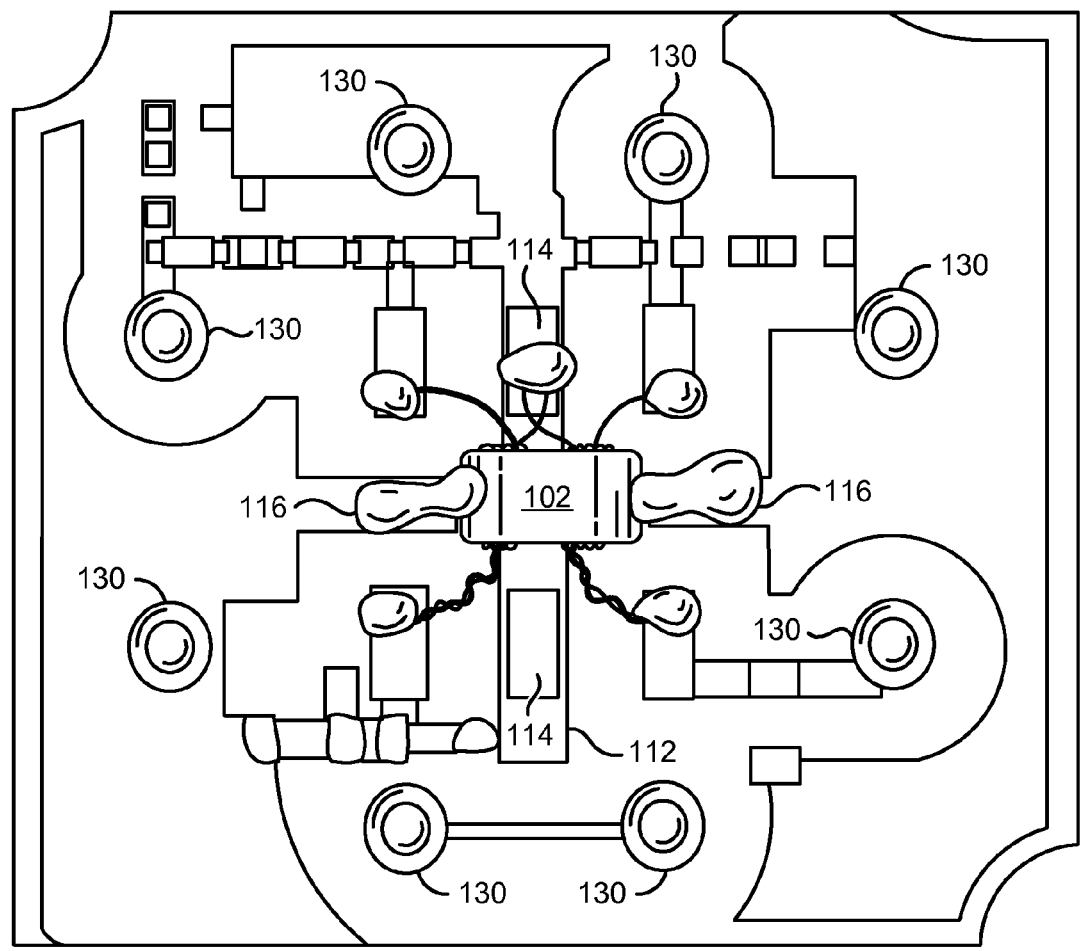
FIG. 6 is a diagram illustrating an RF coupler in accordance with an embodiment of the invention mounted on a carrier substrate with other components.
Figure 7:
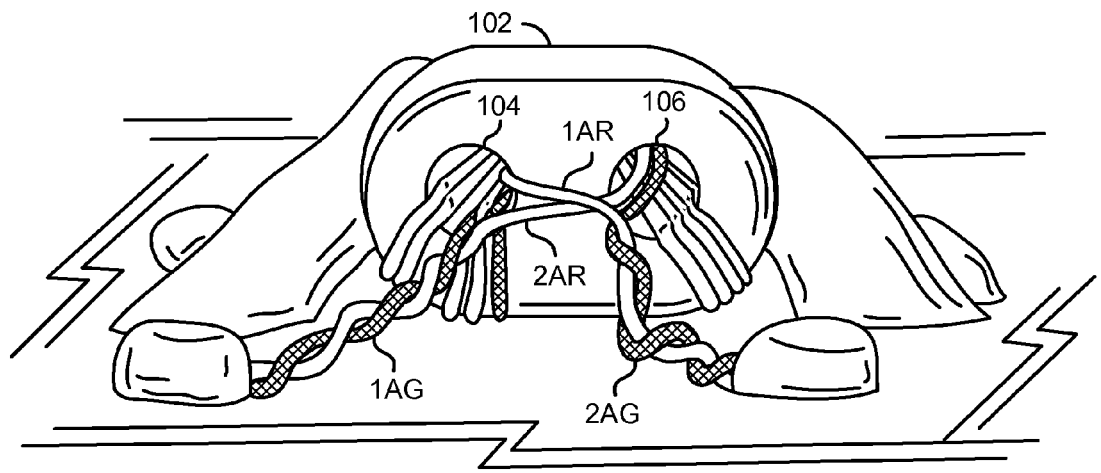
FIG. 7 is a diagram illustrating a view of a first end of an RF coupler wound and positioned in accordance with an embodiment of the invention.
Figure 8:
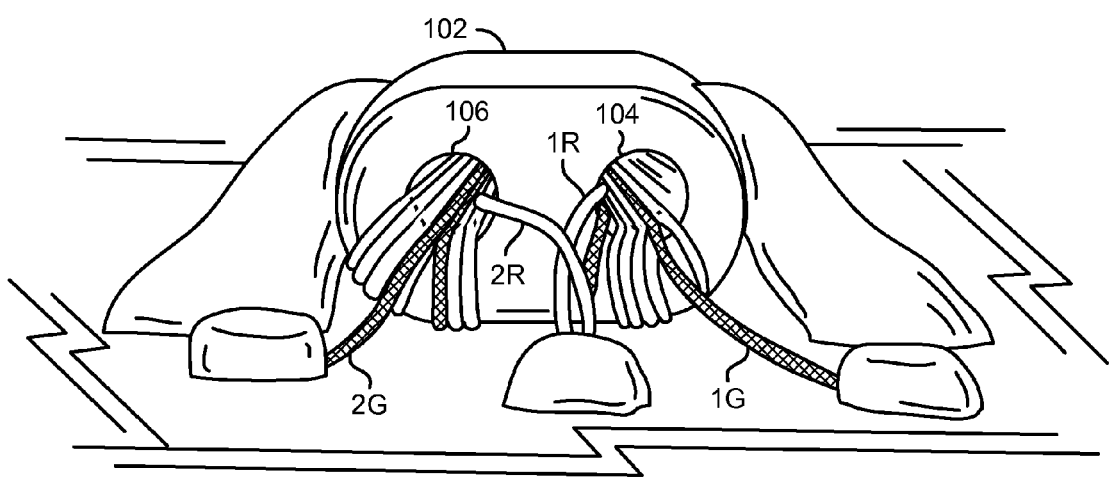
FIG. 8 is a diagram illustrating a view of a second end of the RF coupler of FIG. 6.
Figure 9:
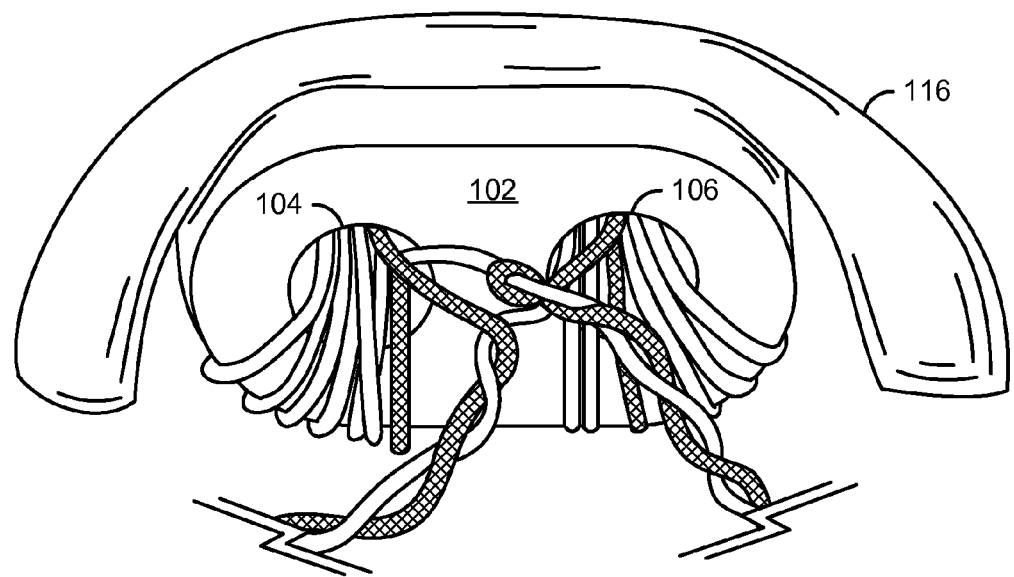
FIG. 9 is a diagram illustrating windings positioned on a first end of the ferrite core of the RF coupler of FIG. 6 after tuning in accordance with an embodiment of the invention.
Figure 10:
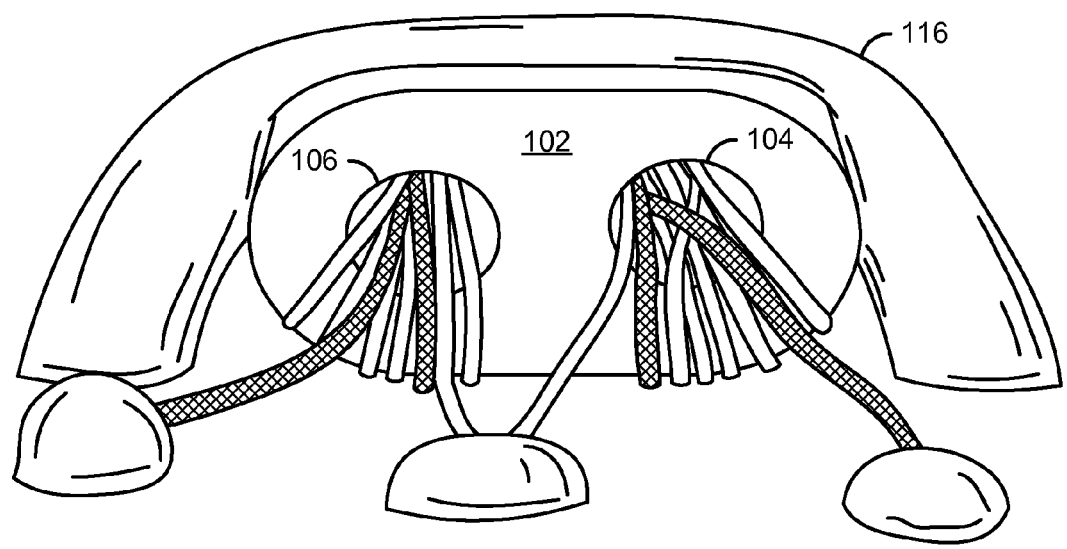
FIG. 10 is a diagram illustrating windings positioned on a second end of the ferrite core of the RF coupler of FIG. 6 after tuning in accordance with an embodiment of the invention.

Referring to FIG. 6, a diagram is shown illustrating an RF coupler in accordance with an embodiment of the invention mounted on a carrier substrate with other components (e.g., resistors, capacitors, etc.). In various embodiments, the ground plane 112 passes under the core 102. The ground plane 112 includes pads 114 to which windings of the RF coupler may be welded or soldered. The RF coupler is mounted to the carrier substrate by adhesive material (e.g., epoxy, etc.) 116. In some embodiments, the adhesive material is applied only to each side of the core 102 (e.g., as illustrated in FIGS. 7 and 8). In some embodiments, the adhesive material is applied continuously from one side of the core 102 to the other side of the core 102 (e.g., as illustrated in FIGS. 9 and 10). In various embodiments, the carrier substrate includes a number of pins 130, which are configured to connect the RF coupler to another circuit board (e.g., as a daughter board or plug-in component/module).

Referring to FIGS. 7 and 8, diagrams are shown illustrating a view of a first end (FIG. 7) and a second end (FIG. 8) of an RF coupler wound and positioned in accordance with an embodiment of the invention. In one example, two turns (one showing) of 34H single-filar (e.g., 1G) may be wound through a first hole of the core. Seven turns (six showing) of 38H single-filar (e.g., 1R) may then be wound through the first hole of the core. The seven turns are started just over the 1G turn near the bottom of the first hole and wind up to finish at the top of the first hole (e.g., 1AR). The seven windings are not overlapped.

Three turns (two showing) of 38H single-filar (e.g., 2R) may be wound through a second hole of the core at the bottom. Two turns (one showing) of 38H single-filar (e.g., 2G) may then be wound through the second hole of the core. The two turns are started just over the 2R turns near the bottom of the second hole and finished as 2AG at the second hole. Four more turns (four showing) of the same single-filar 2AR are wound through the second hole, starting just over the 2G turns near the bottom of the second hole and winding up to finish as 2AR at the top of the second hole. The 2R windings are not overlapped on themselves.

The 1R and 2R wires are brought together, but not tapped or crossed. Wires 1AG & 2AR and 2AG & 1AR are tapped. The two wires 1AR and 2AR are crossed. The wires are then welded (or soldered) to pads on the substrate. The weld (or solder) tabs are epoxied and allowed to cure. The windings are pushed tightly together under the core, and epoxy is carefully added to the outer sides of the core connecting the core to the substrate. The epoxy is not allowed to touch the windings.

Referring to FIGS. 9 and 10, diagrams are shown illustrating windings positioned on a first end (FIG. 9) and a second end (FIG. 10) of the ferrite core of the RF coupler of FIG. 6 after tuning in accordance with an embodiment of the invention. The adhesive material 116 is also shown passing completely over the core 102, which provides increased strength. Tuning is generally not performed until after the weld epoxy has cured. In one example, tuning may include one or more of lifting the bottom winding of 1R over the second winding of 1R on the inside of hole 104, adding a small gap between 2R and 2G, lifting 1R inside hole 104, lowering twisted pair 1AG & 2AR, raising twisted pair 2AG & 1AR, slightly parting each of the 2R windings, and ensuring none of the windings are in the epoxy.

Figure 11:
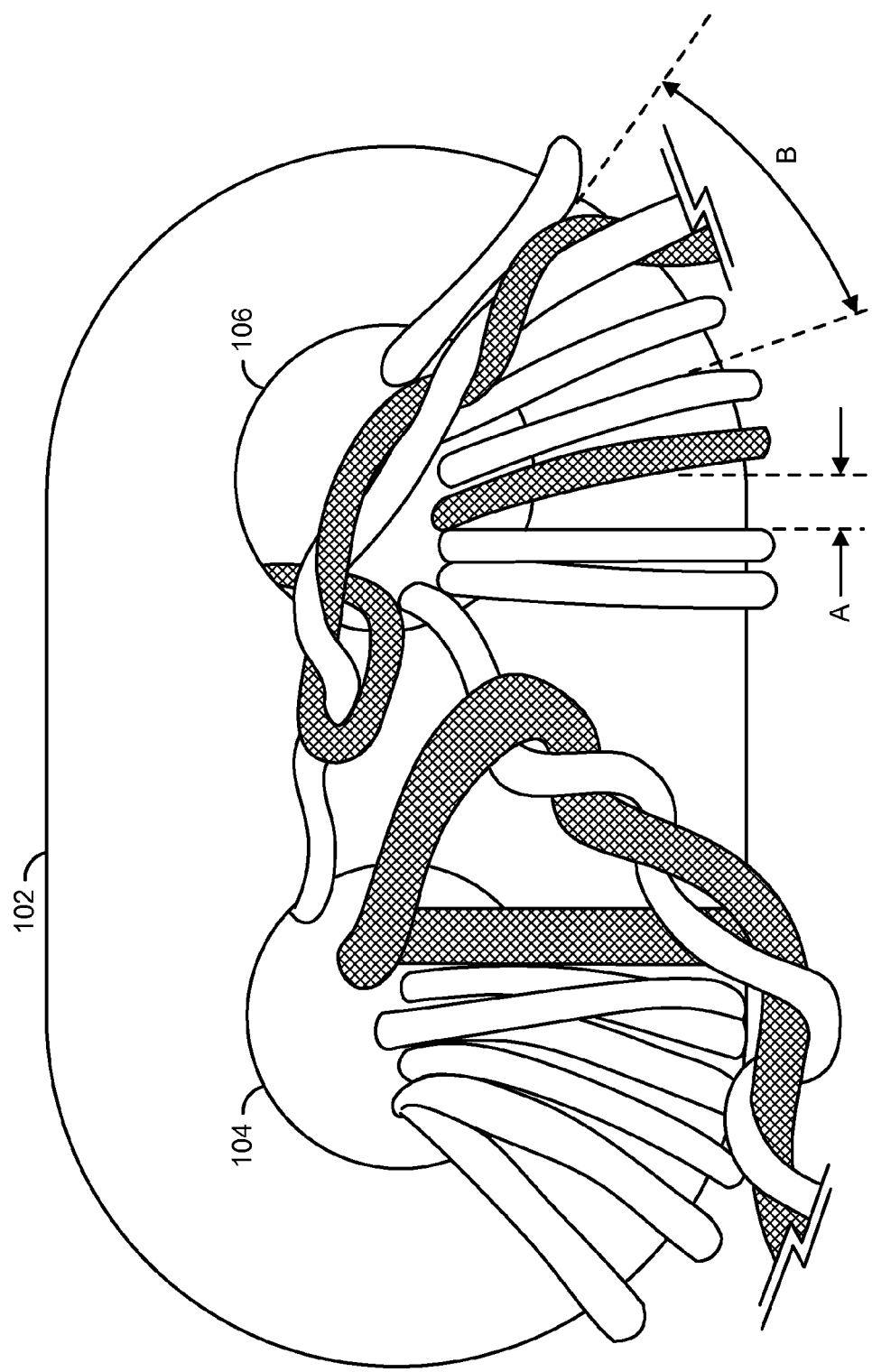
FIG. 11 is magnified version of the diagram of FIG. 9.

Referring to FIG. 11, a diagram is shown illustrating an enlarged version of the diagram of FIG. 9, showing a small gap (A) between the 2R and 2G wires, and the 2R windings spread slightly apart (e.g., identified by the arc B) after tuning the RF coupler.

Figure 12:
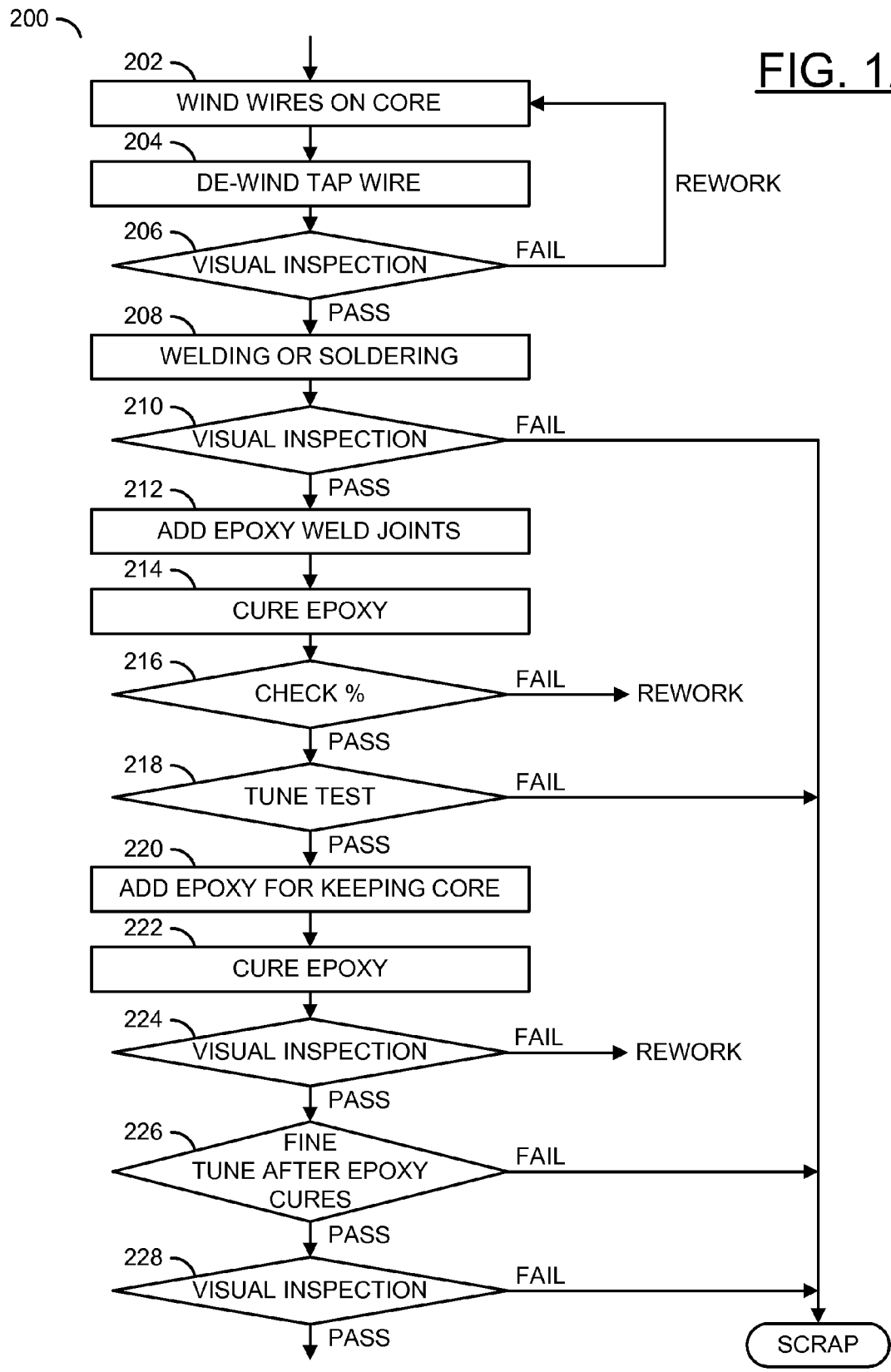
FIG. 12 is a flow diagram illustrating a process in accordance with an embodiment of the invention.

Referring to FIG. 12, a flow diagram is shown illustrating a process 200 in accordance with an embodiment of the invention. In one example, an RF coupler in accordance with an embodiment of the invention may be manufactured using the process 200. The process (or method) 200 may comprise a number of steps (or stages) 202-228. In the step 202, wire windings are wound on a core. In a step 204, a tap wire is unwound. In a step 206, the wire windings are visually inspected. If the coupler fails the inspection, the wire windings are reworked. If the coupler passes the inspection, the process 200 moves to a step 208.

In the step 208, the process 200 welds (or solders) the various wires of the RF coupler to weld/solder tabs on a carrier substrate. In a step 210, the coupler and substrate are visually inspected. If the coupler fails the inspection, the coupler is scrapped. If the coupler passes the inspection, the process 200 moves to a step 212. In the step 212, epoxy is added to the weld joints. In a step 214, the epoxy is allowed to cure. In a step 216, the coupler is checked through electrical testing (e.g., measuring electrical performance using S-parameters). If the check fails, the coupler is reworked. If the check is passed, the process 200 moves to a step 218.

In the step 218, a tuning test is performed. If the coupler fails the tuning test, the coupler is scrapped. If the coupler passes the tuning test, the process 200 moves to a step 220. In the step 220, epoxy is added to the outside of the core to keep the core and windings in place. Care is taken not to contact the windings with the epoxy. In a step 222, the epoxy is allowed to cure. In a step 224, the coupler is visually inspected. If the coupler fails the inspection, the coupler is reworked. If the coupler passes the inspection, the process 200 moves to a step 226. In the step 226, the coupler is fine tuned once the epoxy is cured. If the fine tuning fails, the coupler is scrapped. If the fine tuning passes, the process 200 moves to a step 228. In a step 228, the coupler is visually inspected. If the coupler fails the inspection, the coupler is scrapped. If the coupler passes the inspection, the coupler can proceed to being packaged.

While the invention has been particularly shown and described with reference to the preferred embodiments thereof, it will be understood by those skilled in the art that various changes in form and details may be made without departing from the scope of the invention.

The invention claimed is:
1. An apparatus comprising:
a carrier substrate;
a binocular ferrite core attached to a top surface of said carrier substrate by an adhesive material disposed along a first vertical side of said binocular ferrite core and a second vertical side of said binocular ferrite core, wherein (i) a space is formed between a bottom side surface of said binocular ferrite core, said adhesive material disposed along said first vertical side surface of said binocular ferrite core, said adhesive material disposed along said second side surface of said binocular ferrite core, and said top surface of said carrier substrate, (ii) said adhesive material does not encroach on said space between said binocular core and said carrier substrate and adds tune position security, and (iii) said binocular ferrite core has a first hole and a second hole running parallel to said top surface of said carrier substrate;
a first set of wire windings passing through said binocular ferrite core parallel to said top surface of said carrier substrate and between said bottom side surface of said binocular ferrite core and said top surface of said carrier substrate to which said binocular ferrite core is attached;
a second set of wire windings passing through said binocular ferrite core parallel to said top surface of said carrier substrate and between said bottom side surface of said binocular ferrite core and said top surface of said carrier substrate to which said binocular ferrite core is attached;
a third set of wire windings passing through said binocular ferrite core parallel to said top surface of said carrier substrate and between said bottom side surface of said binocular ferrite core and said top surface of said carrier substrate to which said binocular ferrite core is attached; and
a fourth set of wire windings passing through said binocular ferrite core parallel to said top surface of said carrier substrate and between said bottom side surface of said binocular ferrite core and said top surface of said carrier substrate to which said binocular ferrite core is attached.

2. The apparatus according to claim 1, wherein:
said first set of wire windings and said second set of wire windings pass through said first hole in said binocular ferrite core; and
said third set of wire windings and said fourth set of wire windings pass through said second hole in said binocular ferrite core.

3. The apparatus according to claim 1, wherein at least one of the wire windings is formed with a wire gauge larger than a wire gauge of another of the wire windings.

4. The apparatus according to claim 3, wherein said wire winding formed with the larger gauge wire is a primary winding of the apparatus.

5. The apparatus according to claim 1, wherein said binocular ferrite core comprises a plurality of binocular sections arranged one adjacent to the other along each axis of said first and second holes to form a longer core.

6. The apparatus according to claim 5, wherein the plurality of binocular sections of said binocular ferrite core are epoxied together.

7. The apparatus according to claim 1, wherein said binocular ferrite core is attached to said top surface of said carrier substrate by epoxy disposed along each of said first vertical side and said second vertical side of said binocular ferrite core.

8. The apparatus according to claim 1, wherein said binocular ferrite core is attached to said top surface of said carrier substrate by epoxy disposed over a top surface and down each vertical side of said binocular ferrite core.

9. The apparatus according to claim 1, wherein said wire windings passing between said bottom side surface of said binocular ferrite core and said top surface of said carrier substrate to which said binocular ferrite core is attached are pressed together.

10. The apparatus according to claim 1, wherein a space between one or more wire windings passing between said bottom side surface of said binocular ferrite core and said top surface of said carrier substrate to which said binocular ferrite core is attached are adjusted to obtain a selected performance.

11. The apparatus according to claim 1, wherein said binocular ferrite core and said wire windings form a radio frequency (RF) directional coupler.

12. The apparatus according to claim 1, wherein said carrier substrate contains a ground plane.

13. The apparatus according to claim 1, wherein said binocular ferrite core comprises one or more of Manganese-Zinc Ferrite, Nickel-Zinc Ferrite, Carbonyl, Phenolic, and Polyamide.

14. A method of constructing a radio frequency (RF) coupler comprising the steps of:

winding a first set of wire windings on a binocular ferrite core, wherein said first set of wire windings passes through said binocular ferrite core parallel to a top surface of a carrier substrate and between a bottom side surface of said binocular ferrite core and said top surface of said carrier substrate to which said binocular ferrite core is attached;

winding a second set of wire windings on said binocular ferrite core, wherein said second set of wire windings passes through said binocular ferrite core parallel to said top surface of said carrier substrate and between said bottom side surface of said ferrite core and said top surface of said carrier substrate to which said binocular ferrite core is attached;

winding a third set of wire windings on said binocular ferrite core, wherein said third set of wire windings passes through said binocular ferrite core parallel to said top surface of said carrier substrate and between said bottom side surface of said ferrite core and said top surface of said carrier substrate to which said binocular ferrite core is attached; and winding a fourth set of wire windings on said binocular ferrite core, wherein said fourth set of wire windings passes through said binocular ferrite core parallel to said top surface of said carrier substrate and between said bottom side surface of said ferrite core and said top surface of said carrier substrate to which said binocular ferrite core is attached, wherein said first, second, third, and fourth sets of wire windings are enclosed in a space bounded by said bottom side surface of said ferrite core, said top surface of said carrier substrate, and an adhesive material on each vertical side surface of said binocular ferrite core, said adhesive material attaching said binocular ferrite core to said top surface of said carrier substrate and adding tune position security.

15. The method according to claim 14, wherein said first set of wire windings and said second set of wire windings pass through said first hole in said binocular ferrite core and said third set of wire windings and said fourth set of wire windings pass through said second hole in said binocular ferrite core.

16. The method according to claim 14, wherein said material attaching said binocular ferrite core to said top surface of said carrier substrate comprises epoxy.

17. The method according to claim 16, wherein the epoxy completely encompasses the binocular ferrite core from one side, over the top of the core to the other side.

18. The method according to claim 14, further comprising the step of:

adjusting one or more sets of wire windings to tune a performance parameter of the RF coupler.

19. The method according to claim 18, wherein adjusting the one or more sets of wire windings comprises crossing a pair of windings in at least one of the four sets of wire windings.

20. The method according to claim 18, wherein adjusting the one or more sets of wire windings comprises spacing a pair of windings in at least one of the four sets of wire windings.

* * * * *